(12) United States Patent
Lee

(10) Patent No.: US 7,199,004 B2
(45) Date of Patent: Apr. 3, 2007

(54) METHOD OF FORMING CAPACITOR OF SEMICONDUCTOR DEVICE

(75) Inventor: Kee Jeung Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 326 days.

(21) Appl. No.: 10/999,568

(22) Filed: Nov. 30, 2004

(65) Prior Publication Data

US 2006/0003538 A1   Jan. 5, 2006

(30) Foreign Application Priority Data

Jun. 30, 2004   (KR) .................. 10-2004-0050064

(51) Int. Cl.
*H01L 21/8242* (2006.01)
(52) U.S. Cl. ................ 438/240; 257/E21.008
(58) Field of Classification Search ......... 438/240; 257/E21.008

See application file for complete search history.

(56) References Cited

FOREIGN PATENT DOCUMENTS

| JP | 04202012 A | * | 7/1992 |
| JP | 07017763 A | * | 1/1995 |

* cited by examiner

*Primary Examiner*—Asok Kumar Sarkar
(74) *Attorney, Agent, or Firm*—Ladas & Parry LLP

(57) ABSTRACT

Disclosed is a method of forming a capacitor of a semiconductor device which can secure a desired leakage current characteristic while securing a desired charging capacitance. The inventive method of forming a capacitor of a semiconductor device comprises steps of: forming a bottom electrode on a semiconductor substrate with a storage node contact so that the bottom electrode is connected with the storage node contact; plasma-nitrifying the bottom electrode to form a first nitrification film on the surface of the bottom electrode; forming a LaTbO dielectric film on the bottom electrode including the first nitrification film; plasma-nitrifying the LaTbO dielectric film to form a second nitrification film on the surface of the LaTbO dielectric film; and forming a top electrode on the LaTbO dielectric film including the second nitrification film.

29 Claims, 2 Drawing Sheets

US 7,199,004 B2

METHOD OF FORMING CAPACITOR OF SEMICONDUCTOR DEVICE

BACKGROUND OF THE INVENTION

1. Field of the Invention

The present invention relates to a method of forming a capacitor of a semiconductor device, and more particularly to a method of forming a capacitor of a semiconductor device, which enables the endurance of a capacitor to be secured while securing a desired charging capacitance.

2. Description of the Prior Art

Recently, as the high integration of a memory product is accelerated due to the development of semiconductor fabrication technique, a unit cell area is greatly reduced and an operation voltage is lowered. However, despite the reduction of cell area, it is still requested that the charging capacitance required for operating a memory device be sufficiently high and not less than 25 fF/cell to be sufficient for preventing the occurrence of a soft error and reduction of refresh time.

Accordingly, even though three-dimensional storage electrodes each having an electrode surface of a hemisphere shape have been applied to nitrogen-oxide (NO) capacitors for dynamic random access memories (DRAM's), which employ a Si3N4 film currently deposited as a dielectric using di-chloro-silane (DCS), the heights of the No capacitors are continuously increased so as to secure a sufficient capacitance.

As well known in the art, the charging capacitance of a capacitance is proportional to a surface area of an electrode and a dielectric constant of a dielectric material and reversely proportional to a space between the electrodes, i.e., the thickness of the dielectric.

Meanwhile, the NO capacitors reveal limitations in securing a charging capacitance required for a next generation DRAM of no less than 256 Mbit; accordingly, in order to secure a sufficient charging capacitance, the development of capacitors employing a dielectric film such as $Al_2O_3$ or $HfO_2$ as a dielectric material is vigorously progressed.

However, an $Al_2O_3$ dielectric film has a limit in securing a charging capacitance because its dielectric constant ($\epsilon=9$) is merely two times of that of $SiO_2$ ($\epsilon=3.9$) and is not so high. In addition, a $HFO_2$ dielectric film and a $LaO_2$ dielectric film have dielectric constants of about 20 and 27, respectively, and are more advantageous than the $Al_2O_3$ dielectric film from a standpoint of securing a charging capacitance; however, the leakage current is increased and the strength of breakdown voltage is greatly reduced if the equivalent oxidation film Tox thickness of a dielectric of a capacitor is reduced to about 15 Å, whereby the dielectric film contributes to the deterioration of endurance of the capacitor so that the capacitor is weaken by repeated electric impact.

Consequently, at present, each of the $Al_2O_3$, $HfO_2$ and $La_2O_3$ films is substantially difficult to employ as a dielectric film capable of securing the endurance of a capacitor while securing a desired charging capacitance.

SUMMARY OF THE INVENTION

Accordingly, the present invention has been made to solve the above-mentioned problems occurring in the prior art, and an object of the present invention is to provide a method of forming a capacitor of a semiconductor device which enables sufficient endurance as well as a desired charging capacitance of the capacitor to be secured.

In order to achieve the above-mentioned object, there is provided a method of forming a capacitor of a semiconductor device comprising steps of: forming a bottom electrode on a semiconductor substrate with a contact plug so that the bottom electrode is connected with the contact plug; forming a LaTbO dielectric film on the bottom electrode; and forming a top electrode on the LaTbO dielectric film.

The inventive method of forming a capacitor of a semiconductor device further comprises step of forming a protection film consisting of a silicon nitride film or doped polysilicon in a thickness of about 200 to 1000 Å, after the step of forming the top electrode.

Here, the bottom electrode is formed from doped polysilicon or a metal selected from a group consisting of TiN, TaN, W, WN, WSi, Ru, $RuO_2$, Ir, $IrO_2$ and Pt.

In the case in which the bottom electrode is formed from doped polysilicon, cleaning using HF mixed liquid is performed before forming the LaTbO dielectric film, and cleaning using $NH_4OH$ or $H_2SO_4$ is performed before or after performing the cleaning using the HF mixed liquid.

In the case in which the bottom electrode is formed from doped polysilicon, the surface of the bottom electrode is nitrified to form a diffusion prevention film of $SiN_x$. The nitrification is performed by any one selected from a group consisting of RTP, furnace treatment and plasma treatment under a $NH_3$ gas atmosphere.

The step of forming LaTbO dielectric film may comprise steps of: depositing amorphous LaTbO film, and performing furnace annealing or RTP at a normal or decompressed state under a $N_2$ atmosphere, of which the temperature is 500 to 800° C. and in which $O_2/N_2$ is not more than 0.1, so that impurity included in the LaTbO film is removed and crystallization is induced.

The amorphous LaTbO film is deposited to a thickness of not more than 100 Å, wherein the deposition of the amorphous LaTbO film is performed by using any one selected from a group consisting of $La(CH_3)_3$, $La(iPr—AMD)_3$, $La(C_2H_5)_3$ and other organic metal compounds containing La as a source gas of La component, using $Tb(OC_2H_5)_3$ or $Tb(CH_3)_3$ as a source gas of Tb component, and using any one selected from $O_3$, $O_2$ and $H_2O$ vapor as a reaction gas.

The step of depositing the LaTbO film is performed by any one selected from a group consisting of ALD, pulsed-CVD and LPCVD.

The deposition of the LaTbO film using the ALD or pulsed-CVD may be performed in such a manner of repeating a $LaO_2$ film deposition cycle consisting of La source gas flowing step, purging step, reaction gas flowing step and purging step, and a $Tb_xO_y$ film deposition cycle consisting of Tb source gas flowing step, purging step, reaction gas flowing step and purging step, in a ratio of 9:1 or less, or in such a manner of performing Tb source gas flowing step while controlling the number of times of Tb source gas flowing step in a ratio of 9:1 or less in a cycle consisting of La source gas flowing step, purging step, Tb source gas flowing step, reaction gas flowing step and purging step.

The deposition of LaTbO film using the LPCVD process is performed in such a manner of controlling the organic metal compounds of La and Tb in a ratio of 9:1 or less through a flow controller, supplying each of the organic metal compounds in a constant amount to a vaporizer or a vaporizing tube maintained in a constant temperature in the range of 150° C. to 300° C., thereby vaporizing the organic metal compounds, and then respectively introducing the La component source gas and the Tb component source gas into a LPCVD chamber of 250° C. to 500° C.

In the case in which the top electrode is formed from doped polysilicon, the surface of the LaTbO dielectric film is nitrified before the doped polysilicon is formed, thereby forming a diffusion prevention film of $SiN_x$.

In order to achieve the above-mentioned object, there is also provided a method of forming a capacitor of a semiconductor device comprising steps of: forming a bottom electrode on a semiconductor substrate with a contact plug so that the bottom electrode is connected with the contact plug; nitrifying the surface of the bottom electrode to form a first diffusion prevention film; nitrifying the surface of the LaTbO dielectric film to form a second diffusion prevention film; and forming a top electrode consisting of doped polysilicon.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

At first, referring to the technical principle of the present invention, the present invention uses a LaTbO film which is formed of a $La_2O_3$ film containing about 5% of lanthanide terbium. Such a LaTbO dielectric film is capable of controlling a dielectric constant within a range of 30 to 50 depending on the content of Tb and defining a leakage current level characteristic and a breakdown voltage characteristic.

Consequently, because the dielectric characteristic can be controlled through a process of depositing a LaTbO dielectric film depending on the type of a charge storage electrode and the specification of a capacitor, the present invention is capable of effectively improving the limit in dielectric properties and the leakage current problem, which have been entrained by a conventional $Al_2O_3$ or $HFO_2$ dielectric film, thereby enhancing the capability and reliability of a memory device product.

Hereinafter, a method of forming a capacitor according to a preferred embodiment of the present invention will be described with reference to FIGS. 1 to 3.

Figure 1:
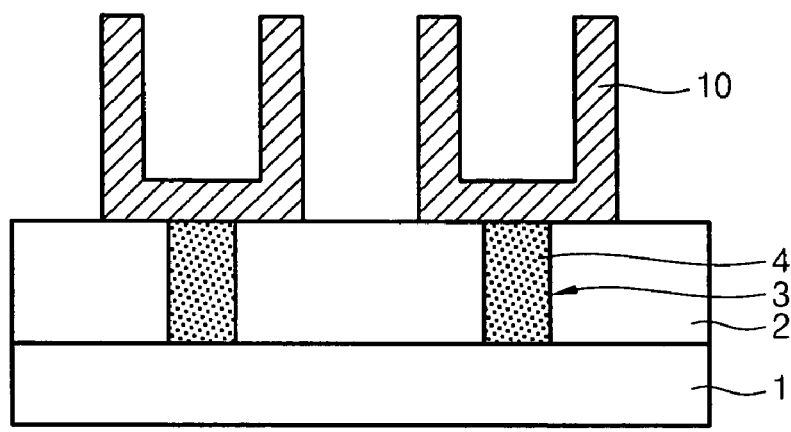
FIGS. 1 to 3 are cross-sectional views showing a method of forming capacitors according to an embodiment of the present invention.

Referring to FIG. 1, an interlayer dielectric film 2 is formed on an entire surface of a semiconductor substrate 1, which is formed with a bottom pattern (not shown) including transistors and bit lines, to cover the bottom pattern. Then, the interlayer dielectric film 2 is etched to form at least one contact hole for exposing a substrate junction area or landing plug poly (LPP) and then a conductive film is embedded in the contact hole 3 to form a contact plug 4. Next, a charge storage electrode, that is, a bottom electrode 10 is formed to be connected with the contact plug 4.

Here, the bottom electrode 10 is formed of doped poly-Si or a metallic material selected from a group consisting of TiN, TaN, W, WN, WSi, Ru, $RuO_2$, Ir, $IrO_2$ or PT.

In addition, although the drawing shows the bottom electrode 10 formed in a cylindrical structure, the electrode 10 may be formed in a simple plate structure or a concave structure.

In addition, in the case in which the bottom electrode 10 is formed from doped polysilicon, it is possible to form hemi-sphere grains on the surfaces of the bottom electrode 10 in order to secure a larger charging capacitance.

Figure 2:
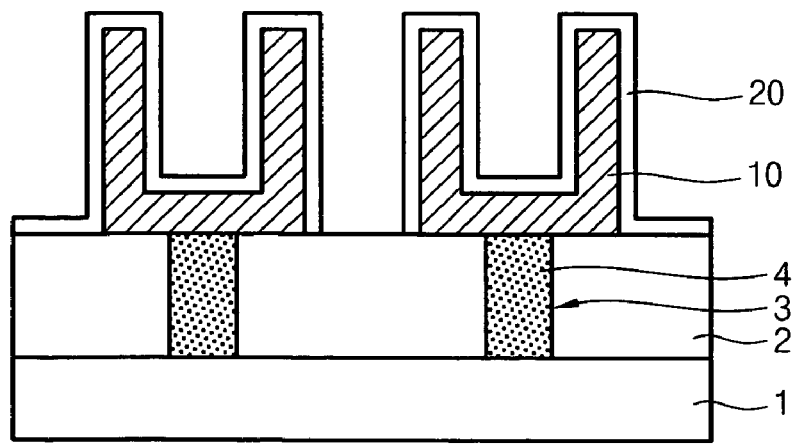

Referring to FIG. 2, an amorphous LaTbO film is formed on the interlayer dielectric film 2 including the bottom electrode 10. Then, furnace annealing or RTP is performed at a normal pressure or decompressed state under an atmosphere of $N_2$, of which the temperature is in the range of 500° C. to 800° C. and in which $O_2/N_2$ is not more than 0.1, in order to strengthen the dielectric property by removing carbonic impurity contained in the amorphous LaTbO film as well as to induce crystallization of the $La_2O_3$ dielectric film 20, whereby a LaTbO dielectric film 20 is formed, which renders the leakage current to be not more than 0.5 fF/cell and the breakdown voltage characteristic to be not less than 7 MV/cm.

Here, at the time of depositing the LaTbO film, $La(CH_3)_3$ or $La(iPr—AMD)_3$ is used as a source gas of La component or $La(C_2H_5)_3$ or another organic metal compound containing La is used as a precursor of the source gas, and $O_3$ (concentration: 200±50 g/m³, 100 to 1000 cc), $O_2$ (100 to 1000 cc) or $H_2O$ vapor is used as a reaction gas. In addition, at the time of depositing the LaTbO, $Tb(OC_2H_5)_3$, or other organic metal compound containing Tb, such as $Tb(CH_3)_3$ is used as a precursor of a source gas of Tb component, and $O_3$ (concentration: 200±20 g/m³), plasma $O_2$ or $H_2O$ vapor is used as a reaction gas.

The deposition of the LaTbO film is performed using ALD, pulsed-CVD or LPCVD.

If the ALD or pulsed-CVD is employed, the $La_2O_3$ film deposition cycle of "La source gas flowing->purging->reaction gas flowing->purging" and the $Tb_xO_y$ film deposition cycle of "Tb source gas flowing->purging->reaction gas flowing->purging" are repeatedly performed in a ratio of 9:1 or less, or the number of times of the Tb source gas flowing is controlled in a ratio of 9:1 or less to deposit a amorphous LaTbO film of not more than 100 Å and then annealing treatment of 500 to 800° C. is performed to remove the impurity contained in the amorphous LaTbO film and to induce crystallization, thereby forming a resultant LaTbO dielectric film 20 with mixed phases.

If the LPCVD is employed, an organic metal compound of La and an organic metal compound of Tb (precursors) as mentioned above are controlled, through a flow controller such as a mass flow controller (MFC), so that the ratio of La to Tb is 9:1 or less, then each of the organic metal compounds is supplied in a constant amount to a vaporizer or a vaporizing tube maintained in a constant temperature within a range of 150 to 300° C., so that the organic metal compounds are vaporized, then a source gas of La component and a source gas of Tb component are respectively introduced into a LPCVD chamber of 250 to 500° C. to primarily deposit an amorphous LaTbo film of not more than 100 Å, and then annealing treatment of 500 to 800° C. is performed to enhance dielectric property and induce crystallization as well as to remove carbonic impurity contained in the film, thereby forming a resultant LaTbO dielectric film 20.

Meanwhile, in the case in which the bottom electrode 10 is formed from doped polysilicon, before forming the LaTbO 20, the surface of the electrode is cleaned using HF mixed liquid, such as $H_2O+HF$ or $NH_4F+HF$, so as to hydrogen-terminate the surface of the bottom electrode simultaneously with removing a natural oxidation film on the bottom electrode formed of the doped polysilicon, and then the surface of the bottom electrode is nitrified, so that a diffusion prevention film is formed on the surface of the bottom electrode.

In addition, before or after performing the cleaning using the HF mixed liquid, the surface of the electrode is cleaned using $NH_4OH$ such as $NH_4OH+H_2O_2+H_2O$ or $H_2SO_4$ mixed solution such as $H_2SO_4+H_2O_2$ or $H_2SO_4+H_2O$, so that inorganic or organic particles and other foreign matters on the surface of the bottom electrode formed of doped polysilicon are removed.

Here, the diffusion prevention film of $SiN_x$ is formed for the purpose of preventing Si or dopants from penetrating into the LaTbO dielectric film 20 in the case in which the bottom electrode is formed of doped polysilicon; the nitrification for forming such a diffusion prevention film of $SiN_x$ is performed with any one selected from a group consisting of RTP, furnace treatment and plasma treatment, under a $NH_3$ gas atmosphere.

Figure 3:
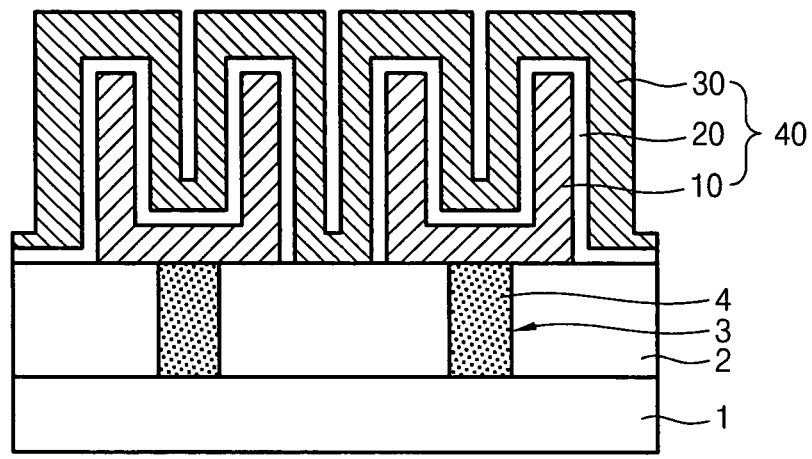
Figure 4:
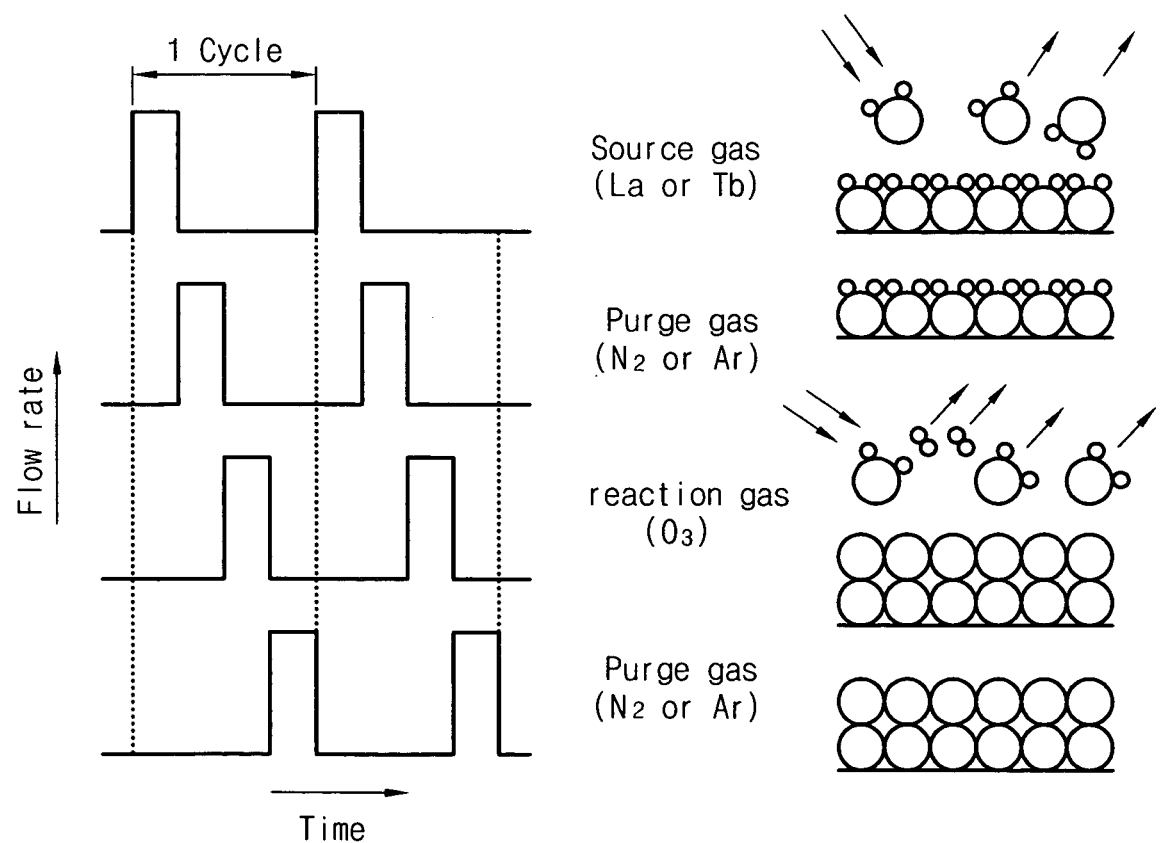
FIG. 4 is a schematic view for describing a method of depositing a LaTbO film employing ALD or pulsed-CVD.

Referring to FIG. 3, by forming a plate electrode, i.e., a top electrode 30 on the LaTbO dielectric film 20 according to a well-known process, the inventive capacitor 40 is completed. Thereafter, a silicon nitrification film or doped polysilicon is deposited on the resultant substrate including the top electrode 30 to a thickness of about 200 to 1000 Å, thereby forming a protection film 50 so as to increase the structural stability of the capacitor 40 against humidity, temperature or electric impact.

Here, the top electrode 30 is formed from doped polysilicon or a metallic material selected from the group consisting of TiN, TaN, W, WSi, Ru, $RuO_2$, Ir, $IrO_2$ and Pt, like the bottom electrode 10. At this time, in the case in which the top electrode 30 is formed from doped polysilicon, a diffusion prevention film of $SiN_x$ is formed on the surface of the LaTbO dielectric film 20 by performing nitrification using any one selected from a group consisting of RTP, furnace treatment and plasma treatment after the formation of the LaTbO dielectric film 20, so that the diffusion prevention film of $SiN_x$ prevents Si or dopants from penetrating into the LaTbO dielectric film 20.

As described above, according to the present invention, by applying a LaTbO dielectric film as a capacitor dielectric, it is possible to obtain a relatively large charging capacitance as compared to $Al_2O_3$, $HFO_2$ or $La_2O_3$ while obtaining an equivalent oxidation film thickness of about 10±5 Å.

In addition, according to the present invention, by applying a LaTbO dielectric film, it is possible to obtain a lower leakage current characteristic and a stronger breakdown voltage characteristic as compared to the case in which the capacitor is configured by applying a $HFO_2$ or $La_2O_3$ dielectric film.

Moreover, as the LaTbO dielectric film has a superior thermal stability as compared to a $HfO_2$ dielectric film, deterioration of electric characteristics is not caused even a high-temperature thermal treatment inevitably entailed by an integration process is performed after the formation of a capacitor. Accordingly, according to the present invention, it is possible to enhance both of endurance and reliability of a capacitor in a semiconductor memory device of 256 Mbit or more, to which device a process of metallic wiring with a line width of 100 nm or less is applied.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of forming a capacitor of a semiconductor device comprising steps of:
    forming a bottom electrode on a semiconductor substrate with a contact plug so that the bottom electrode is connected with the contact plug;
    forming a LaTbO dielectric film on the bottom electrode; and
    forming a top electrode on the LaTbO dielectric film.

2. A method as claimed in claim 1, wherein the bottom electrode is formed from doped polysilicon or a metal selected from a group consisting of TiN, TaN, W, WN, WSi, Ru, $RuO_2$, Ir, $IrO_2$ and Pt.

3. A method as claimed in claim 2, wherein in the case in which the bottom electrode is formed from doped polysilicon, cleaning using HF mixed liquid is performed before forming the LaTbO dielectric film.

4. A method as claimed in claim 3, wherein cleaning using $NH_4OH$ or $H_2SO_4$ is performed before or after performing the cleaning using the HF mixed liquid.

5. A method as claimed in claim 2, wherein in the case in which the bottom electrode is formed from doped polysilicon, the surface of the bottom electrode is nitrified to form a diffusion prevention film of $SiN_x$.

6. A method as claimed in claim 5, wherein the nitrification is performed by any one selected from a group consisting of RTP, furnace treatment and plasma treatment, under an atmosphere of $NH_3$ gas.

7. A method as claimed in claim 1, wherein the step of forming LaTbO dielectric film comprises steps of:
    depositing amorphous LaTbO film, and
    performing furnace annealing or RTP at a normal or decompressed state under a $N_2$ atmosphere, of which a temperature of 500 to 800° C. and in which $O_2/N_2$ is not more than 0.1, so that impurity included in the LaTbo film is removed and crystallization is induced.

8. A method as claimed in claim 7, wherein the amorphous LaTbO film is deposited to a thickness of 100 Å or less.

9. A method as claimed in claim 7, wherein the deposition of the amorphous LaTbO film is performed by using any one selected from a group consisting of $La(CH_3)_3$, $La(iPr—AMD)_3$, $La(C_2H_5)_3$ and other organic metal compounds containing La as a source gas of La component, using $Tb(OC_2H_5)_3$ or $Tb(CH_3)_3$ as a source gas of Tb component, and using any one selected from $O_3$, $O_2$ and $H_2O$ vapor as a reaction gas.

10. A method as claimed in claim 9, wherein the LaTbO film is deposited by any one selected from a group consisting of ALD, pulsed-CVD and LPCVD.

11. A method as claimed in claim 10, wherein the deposition of the LaTbO film using the ALD or pulsed-CVD is performed in such a manner of repeating a $La_2O_3$ film deposition cycle consisting of La source gas flowing step, purging step, reaction gas flowing step and purging step, and a $Tb_xO_y$ film deposition cycle consisting of Tb source gas flowing step, purging step, reaction gas flowing step and purging step, in a ratio of 9:1 or less.

12. A method as claimed in claim 10, wherein the deposition of the LaTbO film using the ALD or pulsed-CVD is performed in such a manner of performing Tb source gas flowing step while controlling the number of times of Tb source gas flowing step in a ratio of 9:1 or less in a cycle consisting of La source gas flowing step, purging step, Tb source gas flowing step, reaction gas flowing step and purging step.

13. A method as claimed in claim 10, wherein the deposition of LaTbO film using the LPCVD process is performed in such a manner of controlling the organic metal compounds of La and Tb in a ratio of 9:1 or less through a flow controller, supplying each of the organic metal compounds in a constant quantity to a vaporizer or a vaporizing tube maintained in a constant temperature in the range of 150° C. to 300° C., thereby vaporizing the organic metal compounds, and then introducing each the La component source gas and the Tb component source gas into a LPCVD chamber of 250° C. to 500° C.

14. A method as claimed in claim 11, wherein the top electrode formed from doped polysilicon or a metal selected from a group consisting of TiN, TaN, W, WN, WSi, Ru, $RuO_2$, Ir, $IrO_2$ and Pt.

15. A method as claimed in claim 14, wherein in the case in which the top electrode is formed from doped polysilicon, the surface of the LaTbO dielectric film is nitrified before the doped polysilicon is formed, thereby forming a diffusion prevention film of $SiN_x$.

16. A method as claimed in claim 15, wherein the nitrification is performed by one selected from RTP, furnace treatment and plasma treatment, under an atmosphere of $NH_3$ gas.

17. A method as claimed in claim 1, wherein after the step of forming the top electrode, the method further comprises step of forming a protection film consisting of a silicon nitride film or doped polysilicon in a thickness of about 200 to 1000 Å.

18. A method of forming a capacitor of a semiconductor device comprising steps of:
forming a bottom electrode on a semiconductor substrate with a contact plug so that the bottom electrode is connected with the contact plug;
nitrifying the surface of the bottom electrode to form a first diffusion prevention film;
forming a LaTbO dielectric film on the bottom electrode;
nitrifying the surface of the LaTbO dielectric film to form a second diffusion prevention film; and
forming a top electrode consisting of doped polysilicon.

19. A method as claimed in claim 18, wherein after the step of forming the bottom electrode and before the step of forming the first diffusion prevention film, the method further comprises step of cleaning using HF mixed liquid.

20. A method as claimed in claim 19, wherein cleaning using $NH_4OH$ or $H_2SO_4$ is performed before or after performing the cleaning using the HF mixed liquid.

21. A method as claimed in claim 18, wherein the step of forming LaTbO dielectric film comprises steps of:
depositing amorphous LaTbO film, and
performing furnace annealing or RTP at a normal or decompressed state under a $N_2$ atmosphere, of which the temperature is 500 to 800° C. and in which $O_2/N_2$ is not more than 0.1, so that impurity included in the LaTbO film is removed and crystallization is induced.

22. A method as claimed in claim 21, wherein the amorphous LaTbO film is deposited to a thickness of not more than 100 Å.

23. A method as claimed in claim 21, wherein the deposition of the amorphous LaTbO film is performed by using any one selected from a group consisting of $La(CH_3)_3$, $La(iPr-AMD)_3$, $La(C_2H_5)_3$ and other organic metal compounds containing La as a source gas of La component, using $Tb(OC_2H_5)_3$ or $Tb(CH_3)_3$ as a source gas of Tb component, and using any one selected from $O_3$, $O_2$ and $H_2O$ vapor as a reaction gas.

24. A method as claimed in claim 21, wherein the LaTbO film is deposited by any one selected from a group consisting of ALD, pulsed-CVD and LPCVD.

25. A method as claimed in claim 24, wherein the deposition of the LaTbO film using the ALD or pulsed-CVD is performed in such a manner of repeating a $La_2O_3$ film deposition cycle consisting of La source gas flowing step, purging step, reaction gas flowing step and purging step, and a $Tb_xO_y$ film deposition cycle consisting of Tb source gas flowing step, purging step, reaction gas flowing step and purging step, in a ratio of 9:1 or less.

26. A method as claimed in claim 24, wherein the deposition of the LaTbO film using the ALD or pulsed-CVD is performed in such a manner of performing Tb source gas flowing step while controlling the number of times of Tb source gas flowing step in a ratio of 9:1 or less in a cycle consisting of La source gas flowing step, purging step, Tb source gas flowing step, reaction gas flowing step and purging step.

27. A method as claimed in claim 18, wherein the deposition of LaTbO film using the LPCVD process is performed in such a manner of controlling the organic metal compounds of La and Tb in a ratio of 9:1 or less through a flow controller, respectively supplying the organic metal compounds in a constant quantity to a vaporizer or a vaporizing tube maintained in a constant temperature in the range of 150° C. to 300° C., so that the compounds are vaporized, and then respectively introducing the La component source gas and the Tb component source gas into a LPCVD chamber of 250° C. to 500° C.

28. A method as claimed in claim 18, wherein the nitrification for forming the first and second diffusion prevention films is performed by any one selected from RTP, furnace treatment and plasma treatment, under a $NH_3$ gas atmosphere.

29. A method as claimed in claim 18, wherein after the step of forming the top electrode, the method further comprises step of forming a protection film consisting of a silicon nitride film or doped polysilicon in a thickness of about 200 to 1000 Å.

* * * * *